(12) United States Patent
Yoshimura et al.

(10) Patent No.: US 9,169,349 B2
(45) Date of Patent: Oct. 27, 2015

(54) POLYESTER COMPOSITION FOR SOLAR BATTERY AND METHOD FOR PRODUCING SAME

(75) Inventors: Hitoshi Yoshimura, Otsu (JP); Yuzo Shimizu, Otsu (JP); Yoshiki Kamigaito, Otsu (JP)

(73) Assignee: Toray Industries, Inc., Tokyo (JP)

( * ) Notice: Subject to any disclaimer, the term of this patent is extended or adjusted under 35 U.S.C. 154(b) by 0 days.

(21) Appl. No.: 13/992,821

(22) PCT Filed: Dec. 12, 2011

(86) PCT No.: PCT/JP2011/078643
§ 371 (c)(1),
(2), (4) Date: Jul. 3, 2013

(87) PCT Pub. No.: WO2012/081529
PCT Pub. Date: Jun. 21, 2012

(65) Prior Publication Data
US 2013/0281635 A1    Oct. 24, 2013

(30) Foreign Application Priority Data
Dec. 16, 2010 (JP) ................. 2010-280356

(51) Int. Cl.
| | | |
|---|---|---|
| C08G 63/181 | (2006.01) |
| H01L 31/042 | (2014.01) |
| C08G 63/91 | (2006.01) |
| C08G 63/183 | (2006.01) |
| C08G 63/80 | (2006.01) |
| C08G 63/83 | (2006.01) |
| H01L 31/048 | (2014.01) |

(52) U.S. Cl.
CPC ............ *C08G 63/916* (2013.01); *C08G 63/183* (2013.01); *C08G 63/80* (2013.01); *C08G 63/83* (2013.01); *H01L 31/0481* (2013.01); *Y02E 10/52* (2013.01)

(58) Field of Classification Search
USPC ........................................ 525/437
See application file for complete search history.

(56) References Cited

U.S. PATENT DOCUMENTS 3,951,905 A * 4/1976 Sano et al. ................. 524/399

FOREIGN PATENT DOCUMENTS

| | | |
|---|---|---|
| JP | 02-296860 | 12/1990 |
| JP | 08-201980 | 8/1996 |
| JP | 10-231413 | 9/1998 |
| JP | 2000-086875 | 3/2000 |
| JP | 2000-336158 | 12/2000 |
| JP | 2002-047340 | 2/2002 |
| JP | 2010084004 A * | 4/2010 |
| JP | 2010-0163613 | 7/2010 |
| JP | 2010-212272 | 9/2010 |
| JP | 2010-229240 | 10/2010 |
| JP | 2010-235824 | 10/2010 |

OTHER PUBLICATIONS

JP 2010-235824 Machine Translation.*
JP 2000-336158 Machine Translation.*
JP2010-084004 English Machine Translation, Jun. 16, 2015.*
International Search Report for International Application No. PCT/JP2011/078643 dated Jan. 10, 2012.

* cited by examiner

*Primary Examiner* — Randy Gulakowski
*Assistant Examiner* — Christopher M Rodd
(74) *Attorney, Agent, or Firm* — RatnerPrestia

(57) ABSTRACT

The present invention provides a polyester composition for a solar battery, which includes a dicarboxylic acid component having terephthalic acid as a main component and a diol component having ethylene glycol as a main component, the polyester composition satisfying the following Formulae (1) to (5): $0.65 \leq$ intrinsic viscosity $\leq 0.90$ (1); $0.7 \leq M/P \leq 1.3$ (2); 200 ppm $\leq P \leq 600$ ppm (3); amount of terminal carboxyl groups $\leq 15$ eq/t (4); and amount of terminal methoxy groups $\leq 10$ eq/t (5) (in the Formula (2), M represents the number of moles of an alkaline metal element and/or an alkaline earth metal element per $10^6$ g of a polyester; and P represents the number of elemental phosphorus per $10^6$ g of a polyester).

3 Claims, No Drawings

POLYESTER COMPOSITION FOR SOLAR BATTERY AND METHOD FOR PRODUCING SAME

CROSS-REFERENCE TO RELATED APPLICATIONS

This application is a U.S. National Phase Application of PCT International Application No. PCT/JP2011/078643, filed Dec. 12, 2011, which claims priority to Japanese Patent Application No. 2010-280356, filed Dec. 16, 2010, the contents of these applications being incorporated by reference herein in their entirety.

FIELD OF THE INVENTION

The present invention relates to a polyester composition. More particularly, the present invention relates to a polyester composition suitable as a solar battery film, which contains only small amount of terminal carboxy groups and terminal methoxy groups and has excellent hydrolysis resistance and heat resistance; and a method of producing the polyester composition.

BACKGROUND OF THE INVENTION

In general, polyesters such as polyethylene terephthalate have excellent mechanical and chemical characteristics and are, therefore, used in a wide range of applications such as those films for magnetic recording media, general industry, heat-sensitive stencil plates, ribbons, reflecting plates, optics, food packings, paper alternatives, mold-release, electric insulation and capacitors.

Particularly, in recent years, attention has been drawn to photovoltaic power generation which is expected to contribute to $CO_2$ reduction; and, in a film for solar battery, there is a demand for an improvement in the hydrolysis resistance, which is one of the required properties, and a reduction in the cost.

As a method of improving the hydrolysis resistance, it is known to perform solid phase polymerization so as to reduce the amount of terminal carboxyl groups. In Patent Document 1, it is described that an electrical insulating film is subjected to solid phase polymerization so as to reduce the cyclic trimer content.

Further, in Patent Documents 2 and 3, it is proposed to further add ethylene glycol during or after esterification reaction.

Moreover, Patent Document 4 proposes a polyester for lamination to a metal plate in which the amount of terminal methoxy groups is reduced.

PATENT DOCUMENTS

[Patent Document 1] JP H02-296860A
[Patent Document 2] JP 2002-47340A
[Patent Document 3] JP 2010-163613A
[Patent Document 4] JP 2000-86875A

SUMMARY OF THE INVENTION

In the polyester described as an electrical insulating film in Patent Document 1, in which the cyclic trimer content is reduced by solid phase polymerization, since the polyester is subjected to a polycondensation reaction at a high temperature prior to the solid phase polymerization, the amount of terminal carboxyl groups is increased due to thermal decomposition and the high amount of terminal carboxyl groups cannot be adequately reduced even with solid phase polymerization, so that it cannot be said that the amount of terminal carboxyl groups is sufficiently low. In addition, in a conventional DMT method where a polyester is produced by using dimethyl terephthalate and ethylene glycol as starting materials, the amount of terminal methoxy groups is high after a polycondensation reaction; therefore, consequently, the time required for solid phase polymerization becomes long and the method is not adequate also from the cost standpoint.

Further, Patent Documents 2 and 3 propose polyesters in which the amount of terminal carboxyl groups is reduced by further adding ethylene glycol during or after esterification reaction. These polyesters contain only a small amount of terminal carboxyl groups; however, since the phosphorus content is also small, the polyesters have poor heat resistance and are thus not appropriate for a solar battery used in harsh environment such as outdoor environment. Furthermore, since the polyesters have a low haze value, when they are made into films, the resulting films have a low surface roughness, making it difficult wind up the films.

Moreover, Patent Document 4 proposes a polyester for lamination to a metal plate in which the amount of terminal methoxy groups is reduced. However, in the polyester, although the amount of terminal methoxy groups is small, since the amount of terminal carboxyl groups is high and the phosphorus content is low, the polyester cannot be used as a film for solar battery.

In view of the above, the present invention provides a polyester composition for a solar battery which solves the above-described problems in prior art and is excellent in the hydrolysis resistance and heat resistance and cost for which properties the demand has become increasingly stringent in recent years.

Benefits of the present invention are achieved by a polyester composition for a solar battery which comprises a dicarboxylic acid component having terephthalic acid as a main component and a diol component having ethylene glycol as a main component, the polyester composition being characterized by satisfying the following Formulae (1) to (5).

$$0.65 \leq \text{intrinsic viscosity} \leq 0.90 \quad (1)$$

$$0.7 \leq M/P \leq 1.3 \quad (2)$$

$$200 \text{ ppm} \leq P \leq 600 \text{ ppm} \quad (3)$$

$$\text{Amount of terminal carboxyl groups} \leq 15 \text{ eq/t} \quad (4)$$

$$\text{Amount of terminal methoxy groups} \leq 10 \text{ eq/t} \quad (5)$$

(in the Formula (2), M represents the number of moles of an alkaline metal element and/or an alkaline earth metal element per $10^6$ g of a polyester; and P represents the number of moles of elemental phosphorus per $10^6$ g of a polyester).

The polyester composition according to the present invention is excellent in the hydrolysis resistance, heat resistance and cost; therefore, it can be preferably used as a film for solar battery.

DETAILED DESCRIPTION OF EMBODIMENTS OF THE INVENTION

The polyester in the present invention is one which is produced by performing a polycondensation reaction using, as main starting materials, a bifunctional component such as an aromatic dicarboxylic acid or a dialkyl ester thereof and a glycol component. Examples of such polyester include, but not particularly restricted to, polyethylene terephthalate, polybutylene terephthalate and polyethylene naphthalate. Thereamong, from the standpoint of the balance between the cost and the performance, a polyester comprising polyethylene terephthalate as a main component is preferred. As for a method of producing such polyester, there is no particular restriction; however, as compared to a DMT method where a dialkyl ester of an aromatic dicarboxylic acid is used as a main material, a direct polymerization method where an aromatic dicarboxylic acid is used as a main material is very inexpensive in terms of the cost and is thus more preferred. The low cost is primarily attributable to the difference in the unit consumption of the materials.

In the polyester or polyethylene terephthalate, not more than 20% by mol (preferably not more than 10% by mol, more preferably not more than 2% by mol) of a copolymer component may be replaced by other dicarboxylic acid or glycol component. Examples of such copolymer component include dicarboxylic acid components such as adipic acid, decanedioic acid, phthalic acid, isophthalic acid, naphthalene-2,6-dicarboxylic acid and 5-sodium sulfoisophthalic acid; polyfunctional carboxylic acid components such as trimellitic acid and pyromellitic acid; and diol components such as tetramethylene glycol, hexamethylene glycol, diethylene glycol, propylene glycol, neopentylglycol, polyoxyalkylene glycol, p-xylylene glycol, 1,4-hexanedimethanol and 5-sodium sulforesorcin. Further, as required, an additive(s) such as a thermal stabilizer, an antioxidant agent and/or an antistatic agent may also be incorporated.

From the standpoints of the strength, processability and the like of the resulting film, the polyester composition according to the present invention is required to have an intrinsic viscosity of 0.65 to 0.90 dl/g, preferably 0.68 to 0.87 dl/g, more preferably 0.71 to 0.84 dl/g. When the intrinsic viscosity is less than 0.65 dl/g, the strength of the resulting film becomes insufficient, while when the intrinsic viscosity is 0.90 dl/g, the time required for solid phase polymerization becomes excessively long, which is disadvantageous in terms of the cost, and there arise problems of, for example, an increase in the filter pressure at the time of melt-formation of a film.

From the standpoints of the hydrolysis resistance and heat resistance, the polyester composition according to the present invention preferably contains a phosphorus compound and an alkaline metal compound and/or an alkaline earth metal compound such that a condition, $0.7 \leq M/P \leq 1.3$, is satisfied (wherein, M represents the number of moles of an alkaline metal element and/or alkaline earth metal element per $10^6$ g of a polyester; and P represents the number of moles of elemental phosphorus per $10^6$ g of a polyester).

As for the definition of the numbers of moles in the ratio M/P, in the above-described metal compounds, for example, the valence of the alkaline metal compound is 1 and the alkaline earth metal is a divalent metal compound. In the present invention, since M defines the molar ratio represented by M/P based on a divalent metal compound, in cases where a metal compound having different valence is used, the value of M/P is calculated with consideration of the valence of the metal compound. Accordingly, when an alkaline metal compound is used, the value of M/P is calculated by using, as M, a value obtained by multiplying the number of moles of the alkaline metal compound by 0.5. Further, in the calculation of M/P, the phosphorus compound is regarded to be divalent.

From the standpoints of the hydrolysis resistance, heat resistance and the like, the value of M/P is preferably 0.8 to 1.2, more preferably 0.9 to 1.1. When the value of M/P is less than 0.7, the polymerization process is retarded, resulting in an increased in the amount of terminal carboxyl groups. Meanwhile, when the value of M/P is higher than 1.3, since the ratio of the alkaline metal element and/or alkaline earth metal element with respect to elemental phosphorus is increased, the heat resistance is deteriorated.

In the present invention, the alkaline metal compound and the alkaline earth metal compound are not particularly restricted. Examples of the alkaline metal compound include lithium acetate, sodium acetate, potassium acetate, lithium benzoate, sodium benzoate, potassium benzoate, lithium carbonate, sodium carbonate, potassium carbonate, lithium hydroxide, sodium hydroxide and potassium hydroxide. Among these alkaline metal compounds, from the standpoints of forming internal particles and reducing the amount of terminal carboxyl group, lithium compounds and potassium compounds are preferred. Further, as the alkaline earth metal compound, acetates and oxides of calcium and magnesium are preferred and, from the standpoint of forming internal particles, calcium acetate and magnesium acetate are particularly preferred. The timing of adding such alkaline metal compound and alkaline earth metal compound is not particularly restricted; however, when a DMT method utilizing a transesterification reaction is employed, it is preferred that these compounds be added before or after the reaction. Meanwhile, when a direct polymerization method utilizing an esterification reaction is employed, it is preferred that these compounds be added at an arbitrary time between the completion of the reaction and the initiation of a polycondensation reaction performed under vacuum. Further, in the case of a direct polymerization method, from the standpoints of attaining stable formation of internal particles and stabilizing the solution haze, it is preferred that an alkaline metal compound and/or an alkaline earth metal compound be added in the form of a solution obtained by adding 3 to 50% of water to the compound(s). The effects are particularly prominent when an alkaline earth metal compound is added. The above-described alkaline metal compounds and alkaline earth metal compounds may be added separately in two or more occasions, or two or more of the compounds may be added in combination.

The polyester composition according to the present invention preferably contains a phosphorus compound in such an amount that the amount of elemental phosphorus is 200 to 600 ppm, preferably 250 to 550 ppm, more preferably 300 to 500 ppm, in terms of the weight of phosphorus atom with respect to the total weight of the polyester composition. When the amount of elemental phosphorus is less than 200 ppm, the heat resistance is reduced and the amount of terminal carboxyl groups is increased, which are not preferred. Meanwhile, when the amount of elemental phosphorus is higher than 600 ppm, polymerization is retarded when the polyester is polymerized, resulting in deterioration of the heat resistance and an increase in the amount of terminal carboxyl groups, which are not preferred.

The phosphorus compound used in the present invention is preferably at least one selected from the group consisting of phosphoric acid, phosphorous acid, phosphonic acid and their methyl esters, ethyl esters, phenyl ester and half esters. It is particularly preferred that the phosphorus compound be a methyl ester, an ethyl ester or a phenyl ester of phosphoric acid, phosphorous acid or phosphoric acid.

In the polyester composition according to the present invention, from the standpoint of the hydrolysis resistance, the amount of terminal carboxyl groups is preferably not greater than 15 eq/t, more preferably not greater than 12 eq/t, still more preferably not greater than 9 eq/t. When the amount of terminal carboxyl groups exceeds 15 eq/t, the hydrolysis resistance is deteriorated, which is not preferred. The lower limit of the amount of terminal carboxyl groups is not particularly restricted; however, from the viewpoints that, for example, even when the time required for solid phase polymerization is considerably extended, the rate of reduction in terminal carboxyl groups is gradually slowed down and the amount of terminal carboxyl groups to which the reduction can be made is limited; and that such extension in the solid phase polymerization time leads to a large increase in the cost, the lower limit of the amount of terminal carboxyl groups is practically not less than about 7 eq/t.

In the polyester composition according to the present invention, the amount of terminal methoxy groups is preferably not greater than 10 eq/t, more preferably not greater than 7 eq/t, still more preferably not greater than 4 eq/t. When the amount of terminal methoxy groups exceeds 10 eq/t, the time required for solid phase polymerization is extended and the productivity is thus reduced, which is not preferred.

Examples of a method of controlling the amount of terminal methoxy groups at not greater than 10 eq/t include (1) a method in which, when performing a transesterification reaction between a dimethyl ester of a dicarboxylic acid and a glycol, the final reaction temperature is retained at 220 to 240° C. for a prolonged period of not shorter than 30 minutes to complete the reaction; and (2) a method in which a polyester is produced by performing an esterification reaction between a dicarboxylic acid and a glycol. From the standpoint of the economical efficiency, the above-described method (2) is preferred; however, since the amount of terminal carboxyl groups tends to be increased, attention must be paid to the below-described points in the production process. It is preferred that the polyester composition according to the present invention comprise substantially no external particle but 0.1 to 1.0% by weight of internal particles containing an alkaline metal compound and/or an alkaline earth metal compound and a phosphorus compound. The amount of the internal particles is preferably 0.2 to 0.9% by weight, more preferably 0.3 to 0.8% by weight. When the polyester composition contains such an amount of internal particles, the surface of the resulting film has an appropriate level of lubricity, so that the winding property of the film is improved. Meanwhile, when the amount of the internal particles exceeds 1.0% by weight, it is required to add a large amount of an alkaline metal compound and/or an alkaline earth metal compound and the heat resistance thus tends to be reduced, which are not preferred.

In the polyester composition according to the present invention, it is preferred that the solution haze is 10 to 50%. In the same manner as described above, when the solution haze is in this range, the resulting film attains good winding property. Meanwhile, when the solution haze is higher than 50%, it is required to add a large amount of an alkaline metal compound and/or an alkaline earth metal compound or external particles and this leads to a reduction in the heat resistance and an increase in the cost, which are not preferred. In particular, when a large amount of titanium oxide or the like is added as the external particles, since the amount of terminal carboxyl groups in the polyester composition becomes high due to high surface activity of the particles, it is preferred to use internal particles having a high affinity to the polyester composition. It is noted here that the solution haze can be determined by the later-described method.

Further, as required, the polyester composition according to the present invention may also appropriately contain other thermoplastic composition, such as polyethylene, polypropylene or polystyrene, and a variety of additives such as a sequestering agent (e.g., carbodiimide, epoxy compound), an ultraviolet absorbing agent, an antioxidant agent, an antistatic agent, an interfacial active agent, a pigment and a fluorescent brightening agent.

Moreover, as required, the polyester composition according to the present invention may also appropriately contain a variety of particles such as inorganic particles (e.g. silica-based inorganic particles, silicates such as aluminum silicate, aluminum oxide, barium sulfate, calcium carbonate, calcium phosphate and titanium dioxide) and organic particles having an acrylic acid, styrene or the like as a constituent. However, since some of these particles cause an increase in the cost and deteriorate the polyester composition, it is preferred that the polyester composition contain no such external particle and that the internal particles be formed by the use of a catalyst added.

In the method of producing a polyester composition according to the present invention, a polyester composition is obtained by performing an esterification reaction or a transesterification reaction and then a polycondensation reaction. Here, from the standpoints of reducing the cost and reducing the amount of terminal methoxy groups and that of terminal carboxyl groups, it is desired that a polyester composition be produced by performing an esterification reaction and then a polycondensation reaction at a low temperature. However, although this method is excellent in terms of the cost, the amount of terminal carboxyl groups is likely to be high; therefore, it is preferred that the technology for reducing the amount of terminal carboxyl groups, which is described below in detail, be employed simultaneously.

In the present invention, in cases where a polyester composition is produced by an esterification reaction and a polycondensation reaction, from the standpoints of the properties of the esterification reaction and the heat resistance, the molar ratio of the diol and dicarboxylic acid components prior to the initiation of the esterification reaction is in the range of preferably 1.05 to 1.40, more preferably 1.05 to 1.30, still more preferably 1.05 to 1.20. When the molar ratio is 1.05 or higher, since the esterification reaction proceeds efficiently and the time cycle is thus shortened, the use of such a molar ratio is advantageous as a commercial process. Meanwhile, when the molar ratio is 1.40 or lower, an increase in the amount of diethylene glycol (DEG) produced as a by-product is small and good heat resistance is attained.

In the method of producing a polyester composition according to the present invention, in cases where a polyester having a small amount of terminal carboxyl groups is produced by using an esterification reaction and a polycondensation reaction, it is preferred that a diol be further added between the completion of the esterification reaction and the initiation of the polycondensation reaction performed under vacuum. Considering the terminal carboxyl group-reducing effect and the productivity, the amount of the diol to be further added is in such a range where the molar ratio of the diol component to the dicarboxylic acid component becomes preferably 1.15 to 2.00, more preferably 1.30 to 1.85, still more preferably 1.45 to 1.70. At a molar ratio of 2.00 or lower, when the diol is further added, not only the amount of diethylene glycol (DEG) produced as a by-product and an increase in the time cycle are small, but also an increase in the cost is limited, which are preferred. In addition, when the molar ratio is 1.15 or higher, depolymerization is sufficiently carried out, so that the terminal carboxyl group-reducing effect is preferably increased.

As for the order of adding a catalyst and a diol after the esterification reaction, for example, (A) a method in which, after adding an alkaline metal compound and/or an alkaline earth metal compound and a phosphorus compound to a lowmolecular-weight polymer obtained after the completion of the esterification reaction, a diol component is added and the resultant is subsequently subjected to a polycondensation reaction to produce a polyester composition; or (B) a method in which after adding a diol component to a low-molecular-weight polymer obtained after the completion of the esterification reaction, an alkaline metal compound and/or an alkaline earth metal compound and a phosphorus compound are added and the resultant is subsequently subjected to a polycondensation reaction to produce a polyester composition may be employed. However, in order to reduce the amount of terminal carboxyl groups in the low-molecular-weight polymer, the method (B) in which a diol component is added first is preferred. Further, from the standpoint of inhibiting the side reactions such as an increased production of diethylene glycol associated with an increase in the reaction time caused by an abrupt temperature reduction, it is preferred that addition of a diol component be performed in several portions.

In the method of producing a polyester composition according to the present invention, the polycondensation reaction is performed at a temperature of preferably not higher than 285° C., more preferably not higher than 280° C. When the temperature of the polycondensation reaction is higher than 285° C., the amount of terminal carboxyl groups becomes high, which is not preferred.

In the method of producing a polyester composition according to the present invention, a polyester in the form of a chip obtained by melt-polymerization is preferably subjected to solid phase polymerization under reduced pressure or in an inert gas atmosphere. For example, after preliminary crystallizing the polyester at a temperature of not higher than 180° C. in advance, the resulting polyester is subjected to solid phase polymerization for 10 to 30 hours at 200 to 240° C. under a reduced pressure of about 1 torr to obtain a chip having an intrinsic viscosity of about 0.8. In cases where solid phase polymerization is performed, the temperature thereof and the conditions of the preliminary crystallization may become critical in order to satisfy both an increase in the intrinsic viscosity and a reduction in the amount of terminal carboxyl groups at the same time. The solid phase polymerization can be performed by heating the polyester under reduced or normal pressure or in nitrogen gas flow with selection of appropriate conditions; however, from the standpoint of, for example, reducing the energy unit consumption, it is preferred that the solid phase polymerization be performed under vacuum without using nitrogen gas.

The polyester composition according to the present invention may be molded into a polyester film. The polyester film may be in the form of an unstretched sheet or a uniaxially or biaxially stretched film.

Further, examples of a method of producing the polyester film include, but not particularly restricted to, the following production method.

That is, after drying a polyester composition, the thus dried polyester composition is melt-extruded to obtain an unstretched sheet, which is then biaxially stretched and heat-treated to produce a film. The biaxial stretching may be either longitudinal and transversal sequential stretching or simultaneous biaxial stretching. Usually, the draw ratio is appropriately 2 to 5 times in each of the longitudinal and transverse directions. In addition, after the biaxial stretching, the resulting film may also be further re-stretched in either the longitudinal or transverse direction. In this case, the polyester composition according to the present invention may also be mixed with a variety of polyesters which may be the same as or different from the catalyst or additive used in the polyester of the present invention. Further, the polyester film according to the present invention may be composed of a single layer or a laminated structure having two or more layers.

By the above-described method, a polyester film can be obtained from the polyester composition according to the present invention, and the polyester film can be used in a variety of applications. The polyester composition according to the present invention is excellent in both hydrolysis resistance and heat resistance; therefore, it can be particularly suitably used as a polyester film for a solar battery. That is, the polyester composition according to the present invention is molded into the form of a film or a sheet or other form to be suitably used as a member of a solar battery panel. Since a solar battery is installed outside, it is likely to be subjected to hydrolysis caused by water vapor and heat as well as decomposition caused by ultraviolet rays. The polyester composition according to the present invention has excellent heat resistance and hydrolysis resistance; therefore, it can be suitably used as a member of a solar battery.

EXAMPLES

The present invention will now be described more concretely by way of examples thereof.

In accordance with the following methods, the physical properties were measured and the evaluations of the effects were conducted.

(1) Intrinsic Viscosity [η] of Polyester Composition

The intrinsic viscosity [η] of a polyester composition was measured in o-chlorophenol at a temperature of 25° C. and a concentration of 0.1 g/cc.

(2) Amount of Metal Elements in Polyester Composition

The fluorescent X-ray strength was determined for each element using a fluorescent X-ray elemental analyzer (model MESA-500W, manufactured by HORIBA Ltd.) and the amount of each metal element was determined from a calibration curve prepared in advance. It is noted here, however, that, for alkaline metal elements such as lithium and potassium, atomic absorption spectrometry (model AA630-13, manufactured by Shimadzu Corporation) was employed to determine the amount from a calibration curve prepared in advance.

(3) Solution Haze of Polyester Composition

In 20 ml of a phenol/ethane tetrachloride mixed solvent (weight ratio=6:4), 0.5 g of a polyester composition was dissolved with stirring at 100° C. for 60 minutes. The resulting solution was cooled to room temperature and then placed in a 20-mm glass cell to measure the haze of the solution using a haze computer (HGM-2DP, manufactured by Suga Test Instruments Co. Ltd.).

(4) Method of Separating and Quantifying Internal Particles Contained in Polyester Composition In 125 ml of o-chlorophenol, 10 g of a polyester composition was dissolved with heating. The resulting solution was treated for 1 hour using a centrifuge at 12,000 rpm and, after removing the resulting supernatant, the precipitates were dried in a vacuum dryer at 120° C. for 1 hour and the weight of the thus dried precipitates was measured.

(5) Amount of Terminal Carboxyl Groups in Polyester Composition

The amount of terminal carboxyl groups in a polyester composition was determined in accordance with the method disclosed by Maurice. That is, 2 g of a polyester composition was dissolved in 50 ml of o-cresol/chloroform (weight ratio=7:3) and the amount of terminal carboxyl groups was measured by titrating the resulting solution with a 1/20 N sodium hydroxide-methanol solution. The thus measured value was expressed as equivalents/$10^6$ g of polyester.

(6) Amount of Terminal Methoxy Groups in Polyester Composition

To 10 ml of hydrazine, 20 g of a polyester composition was added, and the resultant was subjected to alkali decomposition at 100° C. for 40 minutes. The amount of methanol was quantified by gas chromatography and the thus obtained value was expressed as equivalents/$10^6$ g of polyester.

(7) DEG (Diethylene Glycol) Content of Polyester Composition

After thermally decomposing a polyester composition with monomethanolamine, the resultant was diluted with 1,6-hexanediol/methanol and then neutralized with terephthalic acid. Thereafter, the DEG content was determined using a calibration curve prepared in advance based on the peak area obtained by gas chromatography.

(8) Heat Resistance (% BB) of Polyester Composition

A polyester composition in an amount of 8 g was placed in a test tube and heat-treated at 300° C. in a nitrogen gas atmosphere under an increased pressure of 0.1 MPa ($t_0$=10 minutes, t=6 hours) to measure the value of η. The heat resistance was calculated by the following equation. A lower value means a higher thermal stability.

$$\% BB_t = (1/[\eta]_t^{(1/0.75)} - 1/[\eta]_{t0}^{(1/0.75)})$$

(wherein, $[\eta]_t$ represents a value which was measured at the time of a 6-hour heat treatment; and $[\eta]_{t0}$ represents a value which was measured at the time of a 10-minute heat treatment)

(9) Average Particle Size of Titanium Oxide Particles

The particle size distribution of titanium oxide particles was measured using a laser diffraction scattering-type particle size distribution analyzer (LA950, manufactured by HORIBA Ltd.). Titanium oxide was added to a light transmittance of 80 to 90% under the following conditions: measuring temperature=25° C.; circulation velocity of a pure-water solvent=1.2 L/min570 ml/min. The particle size corresponding to a cumulative volume fraction of 50% in the thus obtained equivalent spherical distribution was defined as the average particle size.

(10) Haze of Polyester Film

In accordance with JIS K7105-1981, the central portion of a film in the width direction was cut out in a size of 4.0 cm in the machine direction×3.5 cm in the width direction to prepare a sample. The haze of the sample was measured using a haze meter (HGM-2DP (for light source C), manufactured by Suga Test Instruments Co., Ltd.).

(11) Surface Roughness of Polyester Film (Values of SRa and SRz)

The surface roughness of a polyester film was measured using a three-dimensional fine surface profile analyzer (ET-350K, manufactured by Kosaka Laboratory Ltd.). From the thus obtained surface profile curve, in accordance with JIS B0601, the arithmetic mean roughness (SRa) and the 10-point average surface roughness (SRz) were determined. The measurement conditions were as follows.

Measurement length in the X direction: 0.5 mm
Feeding rate in the X direction: 0.1 mm/sec
Feeding pitch in the Y direction: 5 μm
The number of lines in the Y direction: 40
Cut-off: 0.25 mm
Stylus pressure: 0.02 mN
Height (Z direction) magnification: ×50,000

A centerline average surface roughness (SRa) of 50 to 100 nm and a 10-point average roughness (SRz) of 700 to 1,500 nm were regarded as satisfactory levels.

(11) Hydrolysis Resistance of Polyester Film (the Retention Rate of Elongation after the Film was Left to Stand for 48 Hours at a Temperature of 125° C. and a Humidity of 100%)

In accordance with ASTM-D882 (1999), a sample was cut out in a size of 1 cm×20 cm and stretched at a chuck distance of 5 cm and a tensile rate of 300 mm/min to measure the rupture elongation. Here, the measurement was performed for 5 samples and the average of the measured values was defined as the rupture elongation A0.

Further, as for the retention rate of elongation, after cutting out a sample in the form of a test piece (1 cm×20 cm), using a highly accelerated stress test system (EHS-221MD, manufactured by ESPEC Corp.), the sample was treated for 48 hours at a temperature of 125° C. and a humidity of 100% (equivalent to a pressure of about 1.5 atm; such a treatment performed at a high temperature and a high humidity is referred to as "PCT (Pressure Cooker Test)"). Then, in accordance with ASTM-D882 (1999), the thus treated sample was stretched at a chuck distance of 5 cm and a tensile rate of 300 mm/min to measure the rupture elongation. Here, the measurement was performed for 5 samples and the average of the measured values was defined as the rupture elongation A1. Using the thus obtained values of rupture elongation A0 and A1, the retention rate of elongation was calculated by the following equation (1). A retention rate of elongation of 50% or higher was regarded as satisfactory level.

Retention rate of elongation (%)=$A1/A0 \times 100$  (1)

The retention rate of elongation of a film was measured by taking samples in each of the machine direction (MD) and the transverse direction (TD) of the film.

Example 1

To an esterification reaction apparatus containing bis(2-hydroxyethyl)terephthalate and an oligomer thereof at 250° C., a slurry of terephthalic acid and ethylene glycol (the molar ratio of ethylene glycol/terephthalic acid=1.15) was continuously supplied for 3 hours. During the supply of the slurry, a pressure of 0.1 MPa was applied inside the esterification reaction apparatus, and the esterification reaction was performed at 250° C. for a reaction time of 4 hours, thereby obtaining an oligomer directly polymerized at an esterification reaction rate of 98.0%. The thus obtained esterification reaction product obtained from the loaded slurry was then transferred to a polycondensation reaction canister. To the low-molecular-weight polymer, first, 0.35 mol of ethylene glycol (EG) was further added under normal pressure such that the molar ratio of EG in the reaction system prior to an addition of a catalyst became 1.50 (1.15+0.35) and 5 minutes thereafter, lithium acetate dihydrate was added such that the amount of elemental lithium became 110 ppm with respect to the amount of polyester. Then, 5 minutes later, trimethyl phosphate was added to an amount of elemental phosphorous of 400 ppm and further 5 minutes later, 300 ppm of antimony trioxide was added as a polycondensation catalyst. Then, 5 minutes later, an ethylene glycol solution of calcium acetate monohydrate containing 40% by weight of water was added in an amount of 200 ppm in terms of elemental calcium (M/P=1.0). After stirring the resultant for 10 minutes, the pressure of the reaction system was gradually reduced from normal pressure to 100 Pa over a period of 50 minutes and the temperature was raised to 278° C. to terminate the polycondensation reaction. The resulting polymer was extruded into the form of a strand, which was then cut to obtain a chip of a polyester composition 1 having a length of 4.2 mm, a width of 3.8 mm and a thickness of 2.7 mm. The thus obtained polyester composition 1 had the following properties: an intrinsic viscosity of 0.54 dl/g; an amount of terminal carboxyl groups of 18 eq/$10^6$ g of polyester; an amount of terminal methoxy groups of 0 eq/$10^6$ g of polyester; a DEG content of 1.2% by weight; a solution haze of 25%; an appropriate internal particle amount of 0.5% by weight; and good heat resistance (% BB) of 0.62. Then, using a rotary vacuum polymerization apparatus, the thus obtained chip of the polyester composition 1 was heat-treated for 12 hours at a reduced pressure of 1 mmHg and a temperature of 230° C. to obtain a polyester composition 2 having an intrinsic viscosity of 0.80 and a low amount of terminal carboxyl groups at 10 eq/$10^6$ g of polyester. Thereafter, an unoriented film of 1.2 mm in thickness was prepared using a 40-mm melt-extruder at a preset temperature of 280° C. and a retention time of 6 minutes. The thus obtained film was then biaxially stretched under normal conditions to obtain a biaxially-oriented polyester film of 125 μm in thickness. This polyester film had the following properties: a haze of 47%; surface roughnesses, SRa and SRz, of 70 nm and 1,100 nm, respectively; and a heat-humidity resistance (retention rate of elongation) of 75% in the machine direction (MD) and 76% in the transverse direction (TD), that is, good surface roughnesses and hydrolysis resistance. The results are shown in Tables 1 to 3.

Example 2

Polyester compositions 1 and 2 and a polyester film were obtained in the same manner as in Example 1, except that the amount of elemental calcium and that of elemental phosphorus were changed to 20 ppm and 250 ppm, respectively. The thus obtained polyester composition 1 contained a slightly increased amount of carboxyl groups and had a low solution haze and a low amount of internal particles; however, the film exhibited good hydrolysis resistance. The results are shown in Tables 1 to 3.

Example 3

Polyester compositions 1 and 2 and a polyester film were obtained in the same manner as in Example 1, except that the amount of elemental phosphorus was changed to 550 ppm and the value of M/P was changed to 0.7. The solid phase polymerization time was slightly extended due to the increased amount of elemental phosphorus; however, the polyester film exhibited good properties. The results are shown in Tables 1 to 3.

Example 4

Polyester compositions 1 and 2 and a polyester film were obtained in the same manner as in Example 1, except that the amount of elemental calcium was changed to 350 ppm and the value of M/P was changed to 1.3. Since the value of M/P was high, the amount of terminal carboxyl groups, the solution haze and the amount of internal particles were all slightly higher and in the same manner, the haze and the values of SRa and SRz of the thus obtained film were also slightly higher. Still, the film exhibited good hydrolysis resistance. The results are shown in Tables 1 to 3.

Example 5

Polyester compositions 1 and 2 and a polyester film were obtained in the same manner as in Example 1, except that the further added amount of ethylene glycol was changed to 0.15 mol and the molar ratio of EG in the reaction system prior to the catalyst addition was thus changed to 1.30 (1.15+0.15). Although the amount of terminal carboxyl groups was slightly increased, the thus obtained film exhibited good properties. The results are shown in Tables 1 to 3.

Example 6

Polyester compositions 1 and 2 and a polyester film were obtained in the same manner as in Example 1, except that the molar ratio of EG at the time of performing esterification reaction was changed to 1.10, that the further added amount of ethylene glycol was changed to 0.05 mol and that the molar ratio of EG in the reaction system prior to the catalyst addition was thus changed to 1.15 (1.10+0.05). The amount of terminal carboxyl groups was slightly increased and the hydrolysis resistance was slightly reduced; however, they were within the satisfactory levels. The results are shown in Tables 1 to 3.

Example 7

Polyester compositions 1 and 2 and a polyester film were obtained in the same manner as in Example 1, except that the further added amount of ethylene glycol was changed to 0.70 mol and the molar ratio of EG in the reaction system prior to the catalyst addition was thus changed to 1.85 (1.15+0.70). Due to the increase in the added amount of EG, the amount of terminal carboxyl groups was reduced; however, the amount of DEG was slightly increased and the heat resistance (% BB) was slightly reduced. Still, the thus obtained film exhibited good properties. The results are shown in Tables 1 to 3.

Example 8

Polyester compositions 1 and 2 and a polyester film were obtained in the same manner as in Example 1, except that the solid phase polymerization time was extended to 16 hours. Due to the extended solid phase polymerization time, the productivity was slightly reduced; however, the polyester composition 2 had an intrinsic viscosity of 0.90 and the film exhibited good properties. The results are shown in Tables 1 to 3.

Example 9

Polyester compositions 1 and 2 and a polyester film were obtained in the same manner as in Example 1, except that the solid phase polymerization time was shortened to 10 hours. Due to the shortened solid phase polymerization time, the polyester composition 2 had a reduced intrinsic viscosity of 0.70; however, the thus obtained film exhibited good properties. The results are shown in Tables 1 to 3.

Example 10

Polyester compositions 1 and 2 and a polyester film were obtained in the same manner as in Example 1, except that the polycondensation reaction temperature was changed to 285° C. The amount of terminal carboxyl groups was slightly increased and the hydrolysis resistance was slightly reduced; however, they were within the satisfactory levels. The results are shown in Tables 1 to 3.

Example 11

Polyester compositions 1 and 2 and a polyester film were obtained in the same manner as in Example 1, except that potassium hydroxide was added as an alkaline metal compound in an amount of 610 ppm in terms of elemental potassium. Since the added amount of potassium was large, decomposition was facilitated, so that the amount of terminal carboxyl groups was slightly increased and the hydrolysis resistance was reduced; however, they were within the satisfactory levels. The results are shown in Tables 1 to 3.

Example 12

Polyester compositions 1 and 2 and a polyester film were obtained in the same manner as in Example 1, except that magnesium acetate tetrahydrate was added as an alkaline earth metal compound in an amount of 120 ppm in terms of elemental magnesium. The generation of internal particles was slightly suppressed, so that the solution haze and the like were slightly reduced; however, the thus obtained film exhibited good hydrolysis resistance. The results are shown in Tables 1 to 3.

Example 13

Polyester compositions 1 and 2 and a polyester film were obtained in the same manner as in Example 1, except that an ethylene glycol solution of calcium acetate monohydrate containing 80% by weight of water was added. Since the generation of internal particles was facilitated, the solution haze was slightly increased, and the amount of terminal carboxy groups was increased due to the increase in the amount of added water; however, the thus obtained film exhibited a satisfactory level of hydrolysis resistance. The results are shown in Tables 1 to 3.

Example 14

After dissolving 100 parts of dimethyl terephthalate and 62 parts of ethylene glycol (the molar ratio of EG prior to the initiation of transesterification reaction=1.93) at 140° C., calcium acetate monohydrate was added in an amount of 200 ppm in terms of elemental calcium, followed by addition of antimony trioxide in an amount of 300 ppm. The resulting mixture was heated to 230° C. under normal pressure over a period of 3 hours and retained at 230° C. for 1 hour to complete the transesterification reaction. Thereafter, to the reaction product, lithium acetate dihydrate was added in an amount of 110 ppm in terms of elemental lithium and 5 minutes later, trimethyl phosphate was added to an amount of elemental phosphorous of 400 ppm. Then, after distillating EG while stirring the resulting mixture under normal pressure until the molar ratio of EG in the reaction system became 1.5, the resultant was transferred to a polycondensation reaction canister. Subsequently, the pressure of the reaction system was gradually reduced from normal pressure to 100 Pa over a period of 50 minutes and the temperature was raised to 278° C. to terminate the polycondensation reaction, thereby obtaining a polyester composition. Thereafter, the thus obtained polyester composition was subjected to solid phase polymerization. Since a small amount of terminal methoxy groups still remained, the time of the solid phase polymerization was extended; however, a film having good properties was obtained. The results are shown in Tables 1 to 3.

Comparative Example 1

A polyester composition 1 was obtained in the same manner as in Example 14, except that trimethyl phosphate was added in an amount of 150 ppm (M/P=2.7) in terms of elemental phosphorus and that the transesterification reaction was completed by heating the reaction mixture under normal pressure from 140° C. to 230° C. over a period of 4 hours. Since the value of M/P was high, the heat resistance was deteriorated and the amount of terminal carboxyl groups was increased. Consequently, the resulting film had a low hydrolysis resistance. The results are shown in Tables 1 to 3.

Comparative Example 2

A polyester composition 1 was obtained in the same manner as in Comparative Example 1, except that the amount of elemental phosphorus was changed to 800 ppm and the value of M/P was changed to 0.5. Since the amount of elemental phosphorus was large, the intrinsic viscosity could only be increased to 0.50 during the polycondensation reaction and, due to an extended polycondensation reaction, the amount of terminal carboxyl groups was largely increased as well. Consequently, the thus obtained polyester composition 1 could not attain desired qualities.

Comparative Example 3

Polyester compositions 1 and 2 and a polyester film were obtained in the same manner as in Example 12, except that magnesium acetate tetrahydrate was added as an alkaline earth metal compound in an amount of 6 ppm in team of elemental magnesium without addition of an alkaline metal compound, that trimethyl phosphate was added in an amount of 6 ppm in terms of elemental phosphorus and that the polycondensation temperature was changed to 290° C. Since the amount of elemental phosphorus was small, the heat resistance (% BB) was poor. In addition, generation of internal particles was suppressed, causing a reduction in the solution haze. Consequently, the thus obtained film had a reduced surface roughness and winding of the film was thus difficult. The results are shown in Tables 1 to 3.

Comparative Example 4

Polyester compositions 1 and 2 and a polyester film were obtained in the same manner as in Comparative Example 3, except that 2% by weight of anatase-type titanium oxide particles having an average particle size of 0.6 µm was added to the polyester composition after the addition of the alkaline earth metal and trimethyl phosphate. Due to the surface activity of titanium oxide, decomposition of the polyester composition 1 was facilitated during the polycondensation reaction, so that the polyester composition 1 contained a very large amount of terminal carboxyl groups, which was not sufficiently reduced by the subsequent solid phase polymerization. Therefore, the polyester composition 2 contained an extremely large amount of terminal carboxyl groups. Accordingly, the thus obtained polyester film had an extremely poor hydrolysis resistance. The results are shown in Tables 1 to 3.

Comparative Example 5

A polyester composition 1 was obtained in the same manner as in Example 14, except that the transesterification reaction was completed by heating the reaction mixture under normal pressure from 140° C. to 230° C. over a period of 4 hours. Thereafter, the thus obtained polyester composition 1 was subjected to solid phase polymerization; however, since the transesterification reaction was not sufficiently terminated and a large amount of terminal methoxy groups still remained, the time of the solid phase polymerization was extended and the amount of terminal carboxyl groups was slightly higher, so that the hydrolysis resistance was poor. The results are shown in Tables 1 to 3.

Comparative Example 6

Polyester compositions 1 and 2 were obtained in the same manner as in Example 1, except that the time of the solid phase polymerization was changed to 30 hours and the intrinsic viscosity was thereby increased to 1.00. When a film was produced using the thus obtained polyester composition 2, there occurred a defect in the filter pressure, so that a desired film could not be obtained. The results are shown in Tables 1 to 3.

Comparative Example 7

A polyester composition 1 was obtained in the same manner as in Example 1, except that the intrinsic viscosity after the melt-polycondensation was increased to 0.62. A film was formed using the thus obtained polyester composition 1 without subjecting it to solid phase polymerization; however, due to the large amount of terminal carboxyl groups, only a film having poor hydrolysis resistance could be obtained. The results are shown in Tables 1 to 3.

TABLE 1

| | Production method of polyester composition 1 | Molar ratio of EG at the initiation of reaction (—) | Alkaline metal element Species | Amount (ppm) | Alkaline earth metal element Species | Amount (ppm) | Amount of added water (% by weight) |
|---|---|---|---|---|---|---|---|
| Example 1 | esterification reaction | 1.15 | lithium | 110 | calcium | 200 | 40 |
| Example 2 | esterification reaction | 1.15 | lithium | 110 | calcium | 20 | 40 |
| Example 3 | esterification reaction | 1.15 | lithium | 110 | calcium | 200 | 40 |
| Example 4 | esterification reaction | 1.15 | lithium | 110 | calcium | 350 | 40 |
| Example 5 | esterification reaction | 1.15 | lithium | 110 | calcium | 200 | 40 |
| Example 6 | esterification reaction | 1.1 | lithium | 110 | calcium | 200 | 40 |
| Example 7 | esterification reaction | 1.15 | lithium | 110 | calcium | 200 | 40 |
| Example 8 | esterification reaction | 1.15 | lithium | 110 | calcium | 200 | 40 |
| Example 9 | esterification reaction | 1.15 | lithium | 110 | calcium | 200 | 40 |
| Example 10 | esterification reaction | 1.15 | lithium | 110 | calcium | 200 | 40 |
| Example 11 | esterification reaction | 1.15 | potassium | 610 | calcium | 200 | 40 |
| Example 12 | esterification reaction | 1.15 | lithium | 110 | magnesium | 120 | 40 |
| Example 13 | esterification reaction | 1.15 | lithium | 110 | calcium | 200 | 80 |
| Example 14 | transesterification reaction | 1.93 | lithium | 110 | calcium | 200 | — |
| Comparative Example 1 | transesterification reaction | 1.93 | lithium | 110 | calcium | 200 | — |
| Comparative Example 2 | transesterification reaction | 1.93 | lithium | 110 | calcium | 200 | — |
| Comparative Example 3 | esterification reaction | 1.15 | — | — | magnesium | 6 | 40 |
| Comparative Example 4 | esterification reaction | 1.15 | — | — | magnesium | 6 | 40 |
| Comparative Example 5 | transesterification reaction | 1.93 | lithium | 110 | calcium | 200 | — |
| Comparative Example 6 | esterification reaction | 1.15 | lithium | 110 | calcium | 200 | 40 |
| Comparative Example 7 | esterification reaction | 1.15 | lithium | 110 | calcium | 200 | 40 |

| | Elemental phosphorus (ppm) | M/P (—) | Low molecular weight polymer Molar ratio of EG in the reaction system prior to catalyst addition | External particle Type (—) | Added amount (% by weight) | Polycondensation reaction temperature (°C.) |
|---|---|---|---|---|---|---|
| Example 1 | 400 | 1.0 | 1.50 | — | — | 278 |
| Example 2 | 250 | 1.0 | 1.50 | — | — | 278 |
| Example 3 | 550 | 0.7 | 1.50 | — | — | 278 |
| Example 4 | 400 | 1.3 | 1.50 | — | — | 278 |
| Example 5 | 400 | 1.0 | 1.30 | — | — | 278 |
| Example 6 | 400 | 1.0 | 1.15 | — | — | 278 |
| Example 7 | 400 | 1.0 | 1.85 | — | — | 278 |
| Example 8 | 400 | 1.0 | 1.50 | — | — | 278 |
| Example 9 | 400 | 1.0 | 1.50 | — | — | 278 |
| Example 10 | 400 | 1.0 | 1.50 | — | — | 285 |
| Example 11 | 400 | 1.0 | 1.50 | — | — | 278 |
| Example 12 | 400 | 1.0 | 1.50 | — | — | 278 |
| Example 13 | 400 | 1.0 | 1.50 | — | — | 278 |
| Example 14 | 400 | 1.0 | 1.50 | — | — | 278 |
| Comparative Example 1 | 150 | 2.7 | 1.50 | — | — | 278 |
| Comparative Example 2 | 800 | 0.5 | 1.50 | — | — | 278 |

TABLE 1-continued

|  |  |  |  |  |  |  |
|---|---|---|---|---|---|---|
| Comparative Example 3 | 6 | 1.0 | 1.50 | — | — | 278 |
| Comparative Example 4 | 6 | 1.0 | 1.50 | titanium oxide | 2 | 278 |
| Comparative Example 5 | 400 | 1.0 | 1.50 | — | — | 278 |
| Comparative Example 6 | 400 | 1.0 | 1.50 | — | — | 278 |
| Comparative Example 7 | 400 | 1.0 | 1.50 | — | — | 278 |

TABLE 2

| | Polyester composition 1 After melt-polycondensation | | | | | | |
|---|---|---|---|---|---|---|---|
| | Intrinsic viscosity (dl/g) | Terminal carboxyl group (eq/t) | Terminal methoxy group (eq/t) | DEG (% by weight) | Solution haze (%) | Amount of internal particles (% by weight) | Heat resistance (% BB) (—) |
| Example 1 | 0.54 | 18 | 0 | 1.2 | 25 | 0.5 | 0.62 |
| Example 2 | 0.54 | 20 | 0 | 1.2 | 15 | 0.2 | 0.65 |
| Example 3 | 0.54 | 19 | 0 | 1.2 | 20 | 0.3 | 0.60 |
| Example 4 | 0.54 | 21 | 0 | 1.2 | 55 | 1.1 | 0.70 |
| Example 5 | 0.54 | 20 | 0 | 1.1 | 25 | 0.5 | 0.63 |
| Example 6 | 0.54 | 22 | 0 | 1.1 | 25 | 0.5 | 0.63 |
| Example 7 | 0.54 | 19 | 0 | 1.3 | 26 | 0.5 | 0.67 |
| Example 8 | 0.54 | 18 | 0 | 1.2 | 25 | 0.5 | 0.62 |
| Example 9 | 0.54 | 18 | 0 | 1.2 | 25 | 0.5 | 0.62 |
| Example 10 | 0.54 | 20 | 0 | 1.2 | 26 | 0.5 | 0.65 |
| Example 11 | 0.54 | 20 | 0 | 1.2 | 28 | 0.7 | 0.70 |
| Example 12 | 0.54 | 18 | 0 | 1.2 | 20 | 0.3 | 0.62 |
| Example 13 | 0.54 | 20 | 0 | 1.2 | 30 | 0.8 | 0.65 |
| Example 14 | 0.54 | 18 | 5 | 0.7 | 40 | 0.8 | 0.65 |
| Comparative Example 1 | 0.54 | 30 | 20 | 0.8 | 50 | 1.0 | 0.90 |
| Comparative Example 2 | Increased up to 0.50 by polymerization | 35 | 22 | 0.8 | 30 | 0.6 | 0.80 |
| Comparative Example 3 | 0.54 | 19 | 0 | 1.2 | 1 | 0 | 0.85 |
| Comparative Example 4 | 0.54 | 40 | 0 | 1.3 | not measured | not measured | 1.00 |
| Comparative Example 5 | 0.54 | 25 | 23 | 0.8 | 40 | 0.8 | 0.71 |
| Comparative Example 6 | 0.54 | 19 | 0 | 1.2 | 25 | 0.5 | 0.63 |
| Comparative Example 7 | 0.62 | 35 | 0 | 1.2 | 25 | 0.5 | 0.82 |

| | Polyester composition 2 After solid phase polymerization | | | | | | |
|---|---|---|---|---|---|---|---|
| | Solid phase polymerization time (hr) | Intrinsic viscosity (dl/g) | Terminal carboxyl group (eq/t) | Terminal methoxy group (eq/t) | Elemental phosphorus (ppm) | M/P (—) | Solution haze (%) | Amount of internal particles (% by weight) |
| Example 1 | 12 | 0.80 | 10 | 0 | 400 | 1.0 | 25 | 0.5 |
| Example 2 | 11 | 0.80 | 12 | 0 | 250 | 1.0 | 15 | 0.2 |
| Example 3 | 14 | 0.80 | 11 | 0 | 550 | 0.7 | 20 | 0.3 |
| Example 4 | 12 | 0.80 | 11 | 0 | 400 | 1.3 | 55 | 1.1 |
| Example 5 | 12 | 0.80 | 13 | 0 | 400 | 1.0 | 25 | 0.5 |
| Example 6 | 12 | 0.80 | 14 | 0 | 400 | 1.0 | 25 | 0.5 |
| Example 7 | 12 | 0.80 | 11 | 0 | 400 | 1.0 | 26 | 0.5 |
| Example 8 | 16 | 0.90 | 9 | 0 | 400 | 1.0 | 25 | 0.5 |
| Example 9 | 10 | 0.70 | 13 | 0 | 400 | 1.0 | 25 | 0.5 |
| Example 10 | 12 | 0.80 | 12 | 0 | 400 | 1.0 | 26 | 0.5 |
| Example 11 | 12 | 0.80 | 13 | 0 | 400 | 1.0 | 28 | 0.7 |
| Example 12 | 12 | 0.80 | 11 | 0 | 400 | 1.0 | 20 | 0.3 |
| Example 13 | 12 | 0.80 | 13 | 0 | 400 | 1.0 | 30 | 0.8 |
| Example 14 | 16 | 0.80 | 10 | 5 | 400 | 1.0 | 40 | 0.8 |
| Comparative Example 1 | 20 | 0.80 | 20 | 20 | 150 | 2.7 | 50 | 1.0 |
| Comparative Example 2 | — | — | — | — | — | — | — | — |
| Comparative Example 3 | 12 | 0.80 | 11 | 0 | 6 | 1.0 | 1 | 0 |
| Comparative Example 4 | 12 | 0.80 | 25 | 0 | 6 | 1.0 | not measured | not measured |
| Comparative Example 5 | 25 | 0.80 | 16 | 23 | 400 | 1.0 | 40 | 0.8 |
| Comparative Example 6 | 20 | 1.00 | 9 | 0 | 400 | 1.0 | 25 | 0.5 |
| Comparative Example 7 | Solid phase polymerization was not performed | | | | | | | |

TABLE 3

| | Polyester film | | | | |
|---|---|---|---|---|---|
| | Optical property | Surface roughness | | Hydrolysis resistance (retention rate of elongation) (%) | |
| | Haze (%) | SRa (nm) | SRz (nm) | PCT, 48 hr MD | TD |
| Example 1 | 47 | 70 | 1,100 | 75 | 76 |
| Example 2 | 30 | 50 | 750 | 63 | 62 |
| Example 3 | 40 | 72 | 1,150 | 70 | 70 |
| Example 4 | 90 | 100 | 1,500 | 68 | 70 |
| Example 5 | 47 | 70 | 1,100 | 60 | 60 |
| Example 6 | 46 | 71 | 1,100 | 55 | 55 |
| Example 7 | 49 | 72 | 1,140 | 70 | 70 |
| Example 8 | 47 | 71 | 1,100 | 82 | 82 |
| Example 9 | 47 | 72 | 1,100 | 60 | 60 |
| Example 10 | 49 | 73 | 1,140 | 62 | 61 |
| Example 11 | 52 | 76 | 1,200 | 61 | 62 |
| Example 12 | 40 | 62 | 950 | 70 | 69 |
| Example 13 | 55 | 80 | 1,150 | 60 | 60 |
| Example 14 | 75 | 71 | 1,100 | 73 | 74 |
| Comparative Example 1 | 85 | 71 | 1,100 | 40 | 40 |
| Comparative Example 2 | — | — | — | — | — |
| Comparative Example 3 | 2 | 10 | 100 | 68 | 69 |
| Comparative Example 4 | 100 | 150 | 2,000 | 10 | 9 |
| Comparative Example 5 | 75 | 72 | 1,100 | 47 | 48 |
| Comparative Example 6 | The filter pressure was increased at the time of melt-formation of a film. | | | | |
| Comparative Example 7 | 47 | 72 | 1,100 | 20 | 18 |

The invention claimed is:

1. A polyester composition for a solar battery, which comprises a dicarboxylic acid component having terephthalic acid as a main component and a diol component having ethylene glycol as a main component, said polyester composition comprising substantially no external particle but 0.1 to 1.0% by weight of internal particles consisting of an alkaline metal compound and/or an alkaline earth metal compound and a phosphorus compound and satisfying the following:

$0.65 \leq$ intrinsic viscosity $\leq 0.90$;
  $0.7 \leq M/P \leq 1.3$;
  $200$ ppm $\leq P \leq 600$ ppm;
  amount of terminal carboxyl groups $\leq 15$ eq/t;
  amount of terminal methoxy groups $\leq 10$ eq/t;
  wherein in said Formula (2), M represents the number of moles of an alkaline metal element and/or an alkaline earth metal element per $10^6$ g of a polyester; and
  P represents the number of moles of elemental phosphorus per $10^6$ g of a polyester.

2. The polyester composition for a solar battery according to claim 1, having a solution haze of 10 to 50%.

3. A method of producing the polyester composition for a solar battery according to claim 1, comprising the steps of:
  performing an esterification reaction;
  further adding ethylene glycol to a dicarboxylic acid component at a molar ratio of 1.15 to 2.0;
  adding an alkaline metal compound and/or an alkaline earth metal compound, a phosphorus compound and a polycondensation catalyst to perform a polycondensation reaction at a temperature of not higher than 285° C., thereby obtaining a polyester chip; and
  subjecting the thus obtained polyester chip to a solid phase polycondensation reaction under reduced pressure or in an inert gas atmosphere.

* * * * *